(12) United States Patent
Sasaki et al.

(10) Patent No.: US 10,269,977 B2
(45) Date of Patent: Apr. 23, 2019

(54) SEMICONDUCTOR DEVICE INCLUDING OXIDE SEMICONDUCTOR LAYER HAVING REGIONS WITH DIFFERENT RESISTANCES

(71) Applicant: Japan Display Inc., Tokyo (JP)

(72) Inventors: Toshinari Sasaki, Tokyo (JP); Hiroshi Tabatake, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/686,831

(22) Filed: Aug. 25, 2017

(65) Prior Publication Data

US 2018/0069126 A1 Mar. 8, 2018

(30) Foreign Application Priority Data

Sep. 5, 2016 (JP) .................... 2016-172579

(51) Int. Cl.
*H01L 29/786* (2006.01)
*H01L 27/12* (2006.01)
*H01L 49/02* (2006.01)
*H01L 29/32* (2006.01)
*H01L 29/66* (2006.01)
*G09G 3/32* (2016.01)
*H01L 21/02* (2006.01)
*H01L 21/027* (2006.01)
*H01L 21/441* (2006.01)
*H01L 21/465* (2006.01)

(52) U.S. Cl.
CPC ...... *H01L 29/7869* (2013.01); *H01L 27/1225* (2013.01); *H01L 27/1248* (2013.01); *H01L 27/1255* (2013.01); *H01L 28/60* (2013.01); *H01L 29/32* (2013.01); *H01L 29/66969* (2013.01); *H01L 29/78696* (2013.01); *G09G 3/32* (2013.01); *G09G 2300/0426* (2013.01); *G09G 2300/0819* (2013.01); *G09G 2300/0842* (2013.01); *H01L 21/0274* (2013.01); *H01L 21/02565* (2013.01); *H01L 21/02631* (2013.01); *H01L 21/441* (2013.01); *H01L 21/465* (2013.01)

(58) Field of Classification Search
CPC ..................... H01L 29/7869; H01L 27/1225
USPC ........................................... 257/43
See application file for complete search history.

(56) References Cited

U.S. PATENT DOCUMENTS

2012/0061668 A1* 3/2012 Miyairi ............... H01L 27/1225
  257/43
2012/0258575 A1* 10/2012 Sato .................... H01L 29/7869
  438/151

FOREIGN PATENT DOCUMENTS

JP      2012-227521 A    11/2012

* cited by examiner

*Primary Examiner* — Jami Valentine Miller
(74) *Attorney, Agent, or Firm* — Typha IP LLC

(57) ABSTRACT

A semiconductor device includes an n-type oxide semiconductor layer, a gate electrode above the oxide semiconductor layer, a gate insulation layer between the oxide semiconductor layer and the gate electrode, a first terminal connected to the oxide semiconductor layer, and a second terminal connected to the gate electrode, a potential applied to the second terminal being higher than a potential applied to the first terminal.

8 Claims, 17 Drawing Sheets

SEMICONDUCTOR DEVICE INCLUDING OXIDE SEMICONDUCTOR LAYER HAVING REGIONS WITH DIFFERENT RESISTANCES

CROSS REFERENCE TO RELATED APPLICATIONS

This application is based upon and claims the benefit of priority from the prior Japanese Patent Application No. 2016-172579 filed on Sep. 5, 2016, the entire contents of which are incorporated herein by reference.

FIELD

The present invention is related to a semiconductor device. In particular, the present invention is related to a semiconductor device in which an oxide semiconductor layer is used in a channel.

BACKGROUND

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each pixel and is also used in a driving circuit that selects a pixel to which the voltage or the current is to be supplied. The characteristics required of a semiconductor device vary in accordance with the use thereof. For example, a semiconductor device used as a selective transistor is required to have a low off-current or little variance from other selective semiconductors. A semiconductor device used in a driving circuit is required to have a high on-current.

A semiconductor device including a channel formed of amorphous silicon, low-temperature polysilicon or single crystalline silicon has been conventionally developed for use in a display device as described above. The semiconductor device including a channel formed of amorphous silicon or low-temperature polysilicon is formed in a process at 600° C. or lower and therefore can be formed using a glass substrate. Especially, a semiconductor device including a channel formed of amorphous silicon can be formed with a simpler structure and in a process at 400° C. or lower, and therefore can be formed, for example, using a large glass substrate referred to as an eighth-generation glass substrate (2160×2460 mm). However, such a semiconductor device including a channel formed of amorphous silicon has low mobility and is not usable in a driving circuit.

A semiconductor device including a channel formed of low-temperature polysilicon or single crystalline silicon has higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a process at 500° C. or higher, and therefore cannot be formed using a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has recently been progressively developed (e.g., Japanese Laid-Open Patent Publication No. 2012-227521). It is known that a semiconductor device including a channel formed of an oxide semiconductor can be formed with a simple structure and in a low-temperature process similar to a semiconductor device including a channel formed of amorphous silicon, and has mobility higher than that of a semiconductor device including a channel formed of amorphous silicon. It is also known that such a semiconductor device including a channel formed of an oxide semiconductor has a very low off-current.

In a semiconductor device which uses an oxide semiconductor in a channel, a capacitor element having a MIM (Metal/Insulator/Metal) structure arranged with an insulation layer between a pair of metal layers which serve as an electrode is used in the case where a capacitor element is formed. It is necessary to form an electrode (metal layer) and a dielectric (insulation layer) for forming a capacitor element in order to form a capacitor element having a MIM structure. Therefore, the number of masks and the number of stacked thin films required for manufacturing a semiconductor device increases. As a result, manufacturing costs increase and manufacturing yield decreases.

SUMMARY

A semiconductor device according to an embodiment of the present invention includes an n-type oxide semiconductor layer, a gate electrode above the oxide semiconductor layer, a gate insulation layer between the oxide semiconductor layer and the gate electrode, a first terminal connected to the oxide semiconductor layer, and a second terminal connected to the gate electrode, a potential applied to the second terminal being higher than a potential applied to the first terminal.

A semiconductor device according to an embodiment of the present invention includes a p-type oxide semiconductor layer, a gate electrode above the oxide semiconductor layer, a gate insulation layer between the oxide semiconductor layer and the gate electrode, a first terminal connected to the oxide semiconductor layer, and a second terminal connected to the gate electrode, a potential applied to the second terminal being lower than a potential applied to the first terminal.

DESCRIPTION OF EMBODIMENTS

Figure 1:
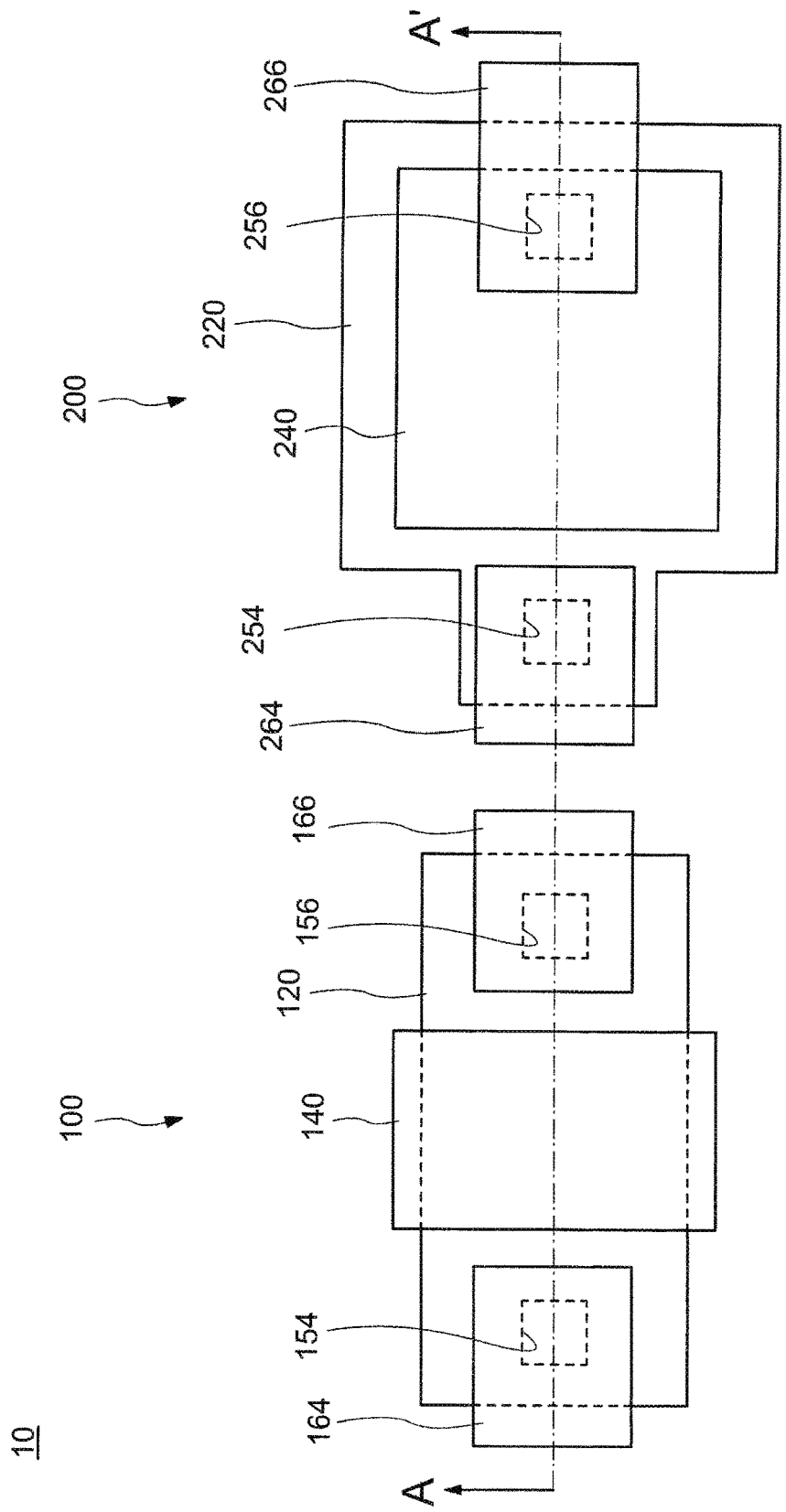
FIG. 1 is a planar diagram showing an outline of a semiconductor device related to one embodiment of the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a highly reliable semiconductor device and a manufacturing method of such a semiconductor device.

<First Embodiment>

With reference to FIG. 1 to FIG. 8, an outline of a semiconductor device 10 in a first embodiment according to the present invention will be described. The semiconductor device 10 in the first embodiment is usable in a pixel or a driving circuit of a liquid crystal display device (LCD), a spontaneous emission display device using an organic light-emitting diode (OLED) such as an organic EL element, a quantum dot or the like for a display unit, or a reflection-type display device such as an electronic paper or the like.

However, the semiconductor device related to the present invention is not limited to those used in a display device. For example, the semiconductor device related to the present invention may also be used in integrated circuits (IC) such as micro-processing units (MPU). The semiconductor device 10 of the first embodiment is a semiconductor device having a structure in which an oxide semiconductor is used as a channel.

[Structure of Semiconductor Device 10]

Figure 2:
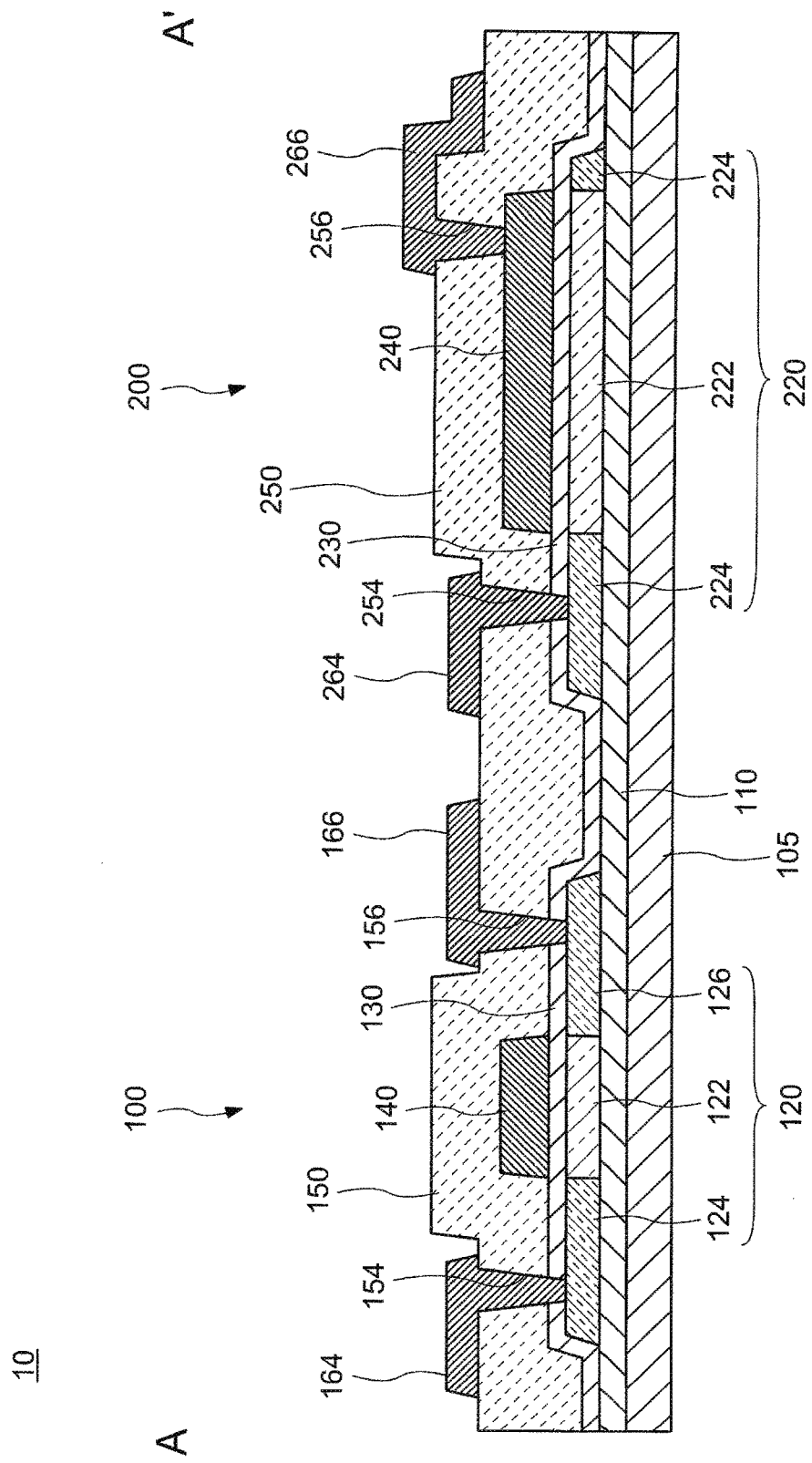
FIG. 2 is a cross-sectional diagram showing an outline of a semiconductor device related to one embodiment of the present invention.

FIG. 1 is a planar diagram showing an outline of a semiconductor device related to one embodiment of the present invention. FIG. 2 is a cross-sectional diagram showing an outline of a semiconductor device related to one embodiment of the present invention. As is shown in FIG. 1 and FIG. 2, a semiconductor device 10 includes a transistor element 100 and a capacitor element 200. Both the transistor element 100 and capacitor element 200 are arranged above an underlayer 110. The underlayer 110 is arranged above a substrate 105.

The transistor element 100 includes an oxide semiconductor layer 120, gate insulation layer 130, gate electrode 140, interlayer insulation layer 150, source electrode 164 and a drain electrode 166. The oxide semiconductor layer 120 is arranged above the underlayer 110. The gate electrode 140 is arranged above the oxide semiconductor layer 120. The gate insulation layer 130 is arranged between the oxide semiconductor layer 120 and the gate electrode 140. The oxide semiconductor layer 120 is arranged with an active layer region 122, a source region 124 and a drain region 126. The active layer region 122 is a region overlapping the gate electrode 140 in a planar view. The source region 124 and drain region 126 are regions exposed from the gate electrode 140 in a planar view.

The interlayer insulation layer 150 is arranged above the gate electrode 140. The interlayer insulation layer 150 covers the oxide semiconductor layer 120 and gate electrode 140. An opening part 154 which reaches the oxide semiconductor layer 120 of the source region 124 and an opening part 156 which reaches the oxide semiconductor layer 120 of the drain region 126 are arranged in the interlayer insulation layer 150 and gate insulation layer 130. A source electrode 164 and drain electrode 166 are arranged above the interlayer insulation layer 150. The source electrode 164 is connected to the oxide semiconductor layer 120 of the source region 124 via the opening part 154. The drain electrode 166 is connected to the oxide semiconductor layer 120 of the drain region 126 via the opening part 156.

As described above, the transistor element 100 is a top-gate type transistor arranged with the gate electrode 140 above the oxide semiconductor layer 120. The resistance of the oxide semiconductor layer 120 in the source region 124 and drain region 126 is lower than the resistance of the oxide semiconductor layer 120 in the active layer region 122 in a state where a potential is not supplied to the gate electrode 140. In other words, electrical conductivity of the oxide semiconductor layer 120 in the source region 124 and drain region 126 is higher than the electrical conductivity of the oxide semiconductor layer 120 in the active layer region 122 in a state where a potential is not supplied to the gate electrode 140. In the present embodiment, there are more impurities included in the oxide semiconductor layer 120 in the source region 124 and drain region 126 than impurities included in the oxide semiconductor layer 120 of the active layer region 122. Materials used in a general semiconductor manufacturing process such as boron (B), phosphorous (P) and argon (Ar) and the like are used as the impurities included in the oxide semiconductor layer 120.

The capacitor element 200 includes an oxide semiconductor layer 220, gate insulation layer 230, gate electrode 240, interlayer insulation layer 250, first electrode 264 and a second electrode 266. The oxide semiconductor layer 220 is arranged above the underlayer 110. The gate electrode 240 is arranged above the oxide semiconductor layer 220. The gate insulation layer 230 is arranged between the oxide semiconductor layer 220 and the gate electrode 240. The oxide semiconductor layer 220 is arranged with a first region 222 and a second region 224. The first region 222 is a region overlapping the gate electrode 240 in a planar view. The second region 224 is a region exposed from the gate electrode 240 in a planar view.

The interlayer insulation layer 250 is arranged above the gate electrode 240. The interlayer insulation layer 250 covers the oxide semiconductor layer 220 and gate electrode 240. An opening part 254 which reaches the oxide semiconductor layer 220 of the second region 224 is arranged in the interlayer insulation layer 250 and gate insulation layer 230. An opening part 256 which reaches the gate electrode 240 is arranged in the interlayer insulation layer 250. The first electrode 264 and second electrode 266 are arranged above the interlayer insulation layer 250. The first electrode 264 is connected to the oxide semiconductor layer 220 of the second region 224 via the opening part 254. The second electrode 266 is connected to the gate electrode 240 via the opening part 256.

As described above, the capacitor element 200 is a capacitor element having a MOS (Metal Oxide Semiconductor) structure in which the oxide semiconductor layer 220 and gate electrode 240 are set as a pair of electrodes and the gate insulation layer 230 is set as a dielectric body. The resistance value of the oxide semiconductor layer 220 in the second region 224 is lower than the resistance value of the oxide semiconductor layer 220 in the first region 222 in a state where a potential is not supplied to the gate electrode 240. In the present embodiment, there are more impurities included in the oxide semiconductor layer 220 in the second region 224 than impurities included in the oxide semiconductor layer 220 in the first region 222.

The magnitude relationship of the potential supplied to the first electrode 264 and the potential supplied to the second electrode 266 is not inverted in the capacitor element 200. For example, in the case where an n type semiconductor is used as the oxide semiconductor layer 220, a higher potential than the first electrode 264 is supplied to the second electrode 266 when driving to maintain a charge in the capacitor element 200. That is, the potential of the second electrode 266 never becomes lower than the potential of the first electrode 264. On the other hand, in the case where a p type semiconductor is used as the oxide semiconductor layer 220, a lower potential than the first electrode 264 is supplied to the second electrode 266 when driving to maintain a charge in the capacitor element 200. That is, the potential of the second electrode 266 never becomes higher than the potential of the first electrode 264. That is, when driving to maintain a charge in the capacitor element 200, the oxide semiconductor layer 220 in the first region 220 is in a conducting state during which carriers are produced and does not becomes a non-conducting state.

[Material of Each Member Forming the Semiconductor Device 10]

A polyimide substrate is used as the substrate 105. In addition to a polyimide substrate, an insulation substrate including a resin such as an acrylic substrate, siloxane substrate or a fluororesin substrate may also be used as the substrate 105. Impurities may also be introduced to the substrate 105 in order to improve the heat resistance of the substrate 105. In particular, since it is not necessary that the substrate 105 be transparent in the case where the semiconductor device 10 is a top-emission type display, impurities which make the level of transparency of the substrate 105 poor may be introduced to the substrate 105. On the other hand, in the case where the substrate 105 does not require flexibility, an insulation substrate having translucency such as a glass substrate, silica substrate and a sapphire substrate may also be used as the substrate 105. In the case where the semiconductor device 10 is not a display device but an integrated circuit, a substrate having translucency such as a semiconductor substrate such as a silicon substrate, silicon carbide substrate or compound semiconductor substrate, or a conductive substrate such as a stainless substrate having conductivity may also be used as the substrate 105.

A material which improves adhesion between the substrate 105 and the oxide semiconductor layer 120 is used as the underlayer 110. A material which suppresses impurities from the substrate 105 from reaching the oxide semiconductor layer 120 is used as the underlayer 110. For example, silicon oxide ($SiO_x$), silicon oxynitride ($SiO_xN_y$), silicon nitride oxide ($SiN_xO_y$), silicon nitride ($SiN_x$), aluminum oxide ($AlO_x$) or aluminum oxynitride ($AlO_xN_y$), aluminum nitride oxide ($AlN_xO_y$) and aluminum nitride ($AlN_x$) may be used as the underlayer 110 (x, y are optional positive integers). A structure may also be used as the underlayer 110 in which these films are stacked. The underlayer 110 may be omitted in the case where sufficient adhesion between the substrate 105 and the oxide semiconductor layer 120 is secured or there are hardly any effects from impurities reaching the oxide semiconductor layer 120 from the substrate 105. In addition to the inorganic insulation materials described above, a TEOS layer or organic insulation materials may also be used as the underlayer 110.

$SiO_xN_y$ and $AlO_xN_y$ are a silicon compound and an aluminum compound containing a smaller amount of nitrogen (N) than oxygen (O). $SiN_xO_y$ and $AlN_xO_y$ are a silicon compound and an aluminum compound containing a smaller amount of oxygen than nitrogen.

The underlayer 110 exemplified above may be formed by a physical deposition method (PVD) or a chemical vapor deposition method (CVD). A sputtering method, vacuum deposition method, electron beam deposition method and molecular beam epitaxy method may be used as the PVD method. A thermal CVD method, plasma CVD method and catalytic CVD method (Cat (Calatlytic)-CVD method or hotwire CVD method) may be used as the CVD method. A TEOS layer indicates a CVD layer in which TEOS (Tetra Ethyl Ortho Silicate) is the raw material.

A polyimide resin, acrylic resin, epoxy resin, silicone resin, fluororesin, siloxane resin and the like are used as the organic insulating material. The underlayer layer 110 may be a single layer or stacked layers of the materials described above. For example, the underlayer 110 may include stacked layers of inorganic insulating materials and organic insulating materials.

A metal oxide having semiconductor characteristics is used as the oxide semiconductor layers 120 and 220. For example, an oxide semiconductor containing indium (In), gallium (Ga), zinc (Zn), and oxygen (O) may be used as the oxide semiconductor layers 120 and 220. In particular, an oxide semiconductor having a composition ratio of In:Ga:Zn:O=1:1:1:4 may be used as the oxide semiconductor layers 120 and 220. However, the oxide semiconductor including In, Ga, Zn and O used in one embodiment of the present invention is not limited to the composition described above. An oxide semiconductor having a composition different from that described above may be used as the oxide semiconductor including In, Ga, Zn, and O. For example, an oxide semiconductor having a large ratio of In with respect to the ratio described above may be used as the oxide semiconductor layers 120 and 220 in order to improve mobility. An oxide semiconductor having a large ratio of Ga with respect to the ratio described above may be used as the oxide semiconductor layers 120 and 220 in order to reduce the influence of light irradiation and increase a band gap.

Other elements may be added to the oxide semiconductor including In, Ga, Zn, and O. For example, a metal element such as Al, Sn or the like may be added to the oxide semiconductor described above. In addition to the oxide semiconductor described above, zinc oxide (ZnO), nickel oxide (NiO), tin oxide ($SnO_2$), titanium oxide ($TiO_2$), vanadium oxide ($VO_2$), indium oxide ($In_2O_3$) and strontium titanate ($SrTiO_3$) and the like may be used as the oxide semiconductor layers 120 and 220. The oxide semiconductor layers 120 and 220 may be amorphous or crystalline. The oxide semiconductor layers 120 and 220 may also be a mixed phase of amorphous and crystal.

An inorganic insulation material such as $SiN_x$, $SiN_xO_y$, $SiO_xN_y$, $AlN_x$, $AlN_xO_y$, and $AlO_xN_y$ is used as the gate insulation layers 130, 230. The gate insulation layers 130, 230 are formed using the same method as the underlayer 110. The gate insulation layers 130, 230 may be a single layer or stacked layers of the materials described above. The gate insulation layers 130, 230 may be of the same material or a different material as the underlayer 110.

A general metal material or conductive semiconductor material is used as the gate electrodes 140, 240. For example, aluminum (Al), titanium (Ti), chrome (Cr), cobalt (Co), nickel (Ni), zinc (Zn), molybdenum (Mo), indium (In), tin (Sn), hafnium (Hf), tantalum (Ta), tungsten (W), platinum (Pt) or bismuth (Bi) is used as the gate electrodes 140, 240. An alloy of the materials described above or a nitride of these materials may also be used as the gate electrodes 140, 240. A conductive oxide semiconductor such as ITO (indium/tin/oxide), IGO (indium/gallium/oxide) IZO (indium/zinc/oxide) or GZO (zinc oxide added with gallium as a dopant) may be used as the gate electrodes 140, 240. The gate electrodes 140, 240 may be a single layer or stacked layers of the materials described above.

The material used as the gate electrodes 140, 240 is preferred to be a material having thermal resistance to a heat treatment process in the manufacturing process of a semiconductor device in which an oxide semiconductor is used as a channel. It is preferred that a material having a work function serving as an enhancement type material in which a transistor is OFF when 0V is applied to the gate electrodes 140, 240 is used as the gate electrodes 140, 240. However, since the capacitor element 200 operates the oxide semiconductor layer 220 of the first region 222 in a conducting state, a material having a work function serving as a depression type material in which a transistor is ON when 0V is applied to the gate electrodes 140, 240 may also be used as the gate electrode 240.

An inorganic insulation material such as $SiO_x$, $SiO_xN_y$, $AlO_x$, $AlO_xN_y$ or a TEOS layer is used as the interlayer insulation layers 150, 250. The interlayer insulation layers 150, 250 may be formed using the same method as the underlayer 110. The interlayer insulation layers 150, 250 may be a single layer or stacked layers of the materials described above. The interlayer insulation layers 150, 250 may include a large amount of oxygen compared to a stoichiometric mixture ratio of a material used as the interlayer insulation layers 150, 250. The interlayer insulation layers 150, 250 may include the same material as a material included in the oxide semiconductor layers 120, 220 or may be structured using a different material to the material used in the oxide semiconductor layers 120, 220.

A general metal material or a conductive semiconductor material is used for the source electrode 164, drain electrode 166, first electrode 264 and second electrode 266 the same as the gate electrodes 140, 240. For example, Al, Ti, Cr, Co, Ni, Zn, Mo, In, Sn, Hf, Ta, W, Pt and Bi may be used as the electrodes described above. An alloy of these materials or a nitride of these materials may also be used as the electrodes described above. A conductive oxide semiconductor such as ITO, IGO, IZO and GZO may also be used as the electrodes described above. The electrodes described above may be a single layer or stacked layers of the above described materials. The material used as the electrodes described above is preferred to be a material having thermal resistance to a heat treatment process in the manufacturing process of a semiconductor device in which an oxide semiconductor is used as a channel. A material with a low contact resistance with the oxide semiconductor layers 120, 220 is preferred to be used as the source electrode 164, drain electrode 166 and first electrode 264. A material with a low contact resistance with the gate electrode 240 is preferred to be used as the second electrode 266.

[Pattern of First Region 222 and Second Region 224]

Figure 3:
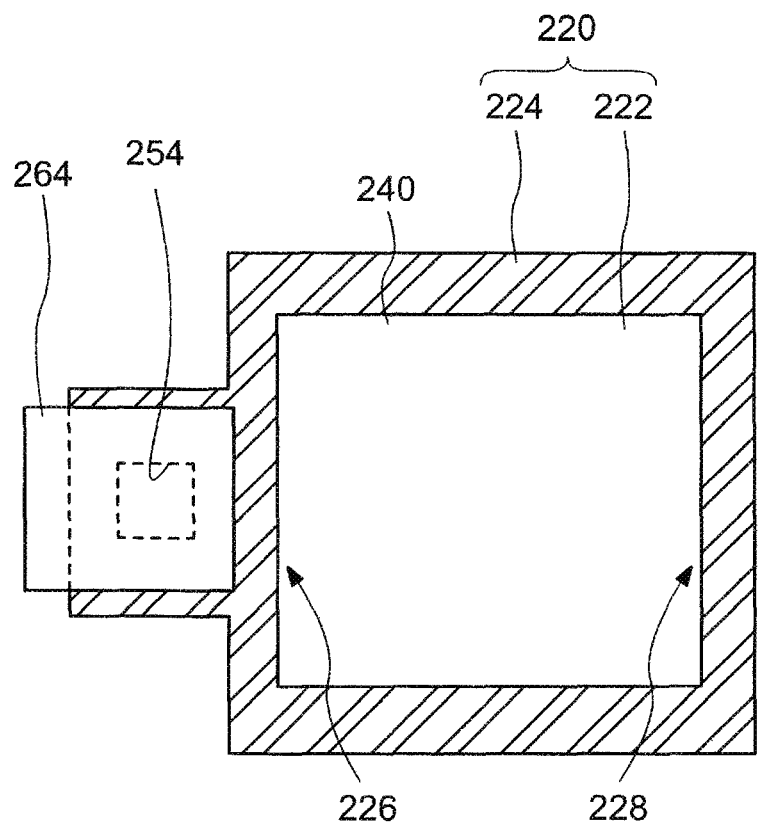
FIG. 3 is a planar diagram showing a first region and a second region of an oxide semiconductor layer in a semiconductor device related to one embodiment of the present invention.

FIG. 3 is a planar view diagram showing a first region and a second region of an oxide semiconductor layer in the semiconductor device related to one embodiment of the present invention. The shape of the first region 222 and the second region 224 in the capacitor element 200 of the semiconductor device 10 related to the first embodiment of the present invention is explained using FIG. 3. In FIG. 3, the second region 224 is the region drawn by a hatched line. The second electrode 226 and opening part 256 drawn in FIG. 1 are omitted it FIG. 3. As is shown in FIG. 3, the second region 224 consecutively surrounds the first region 222. In other words, the second region 224 surrounds the circumference of the first region 222 uninterrupted. Furthermore, in other words, in a direction D1, the second region 224 is respectively arranged in an opposite direction with respect to the first region 222, and in a direction D2 which is perpendicular to the direction D1, the second region 224 is respectively arranged in an opposite direction with respect to the first region 222.

When the second region 224 consecutively surrounds the first region 222, it is possible to shorten the longest distance (distance between the furthest point from the second region 224 in the first region 222 and the nearest second region 224 from that point) from the second region 224 in the first region 222. Even if the second region 224 exists only on the first side surface 226 of the first region 222, the distance between the second side surface 228 on the opposite side to the first side surface 226 in the direction D1 and the second region 224 arranged on the first side surface 226 becomes further. In the case where the resistance of the first region 222 in a conducting state is higher than the resistance of the second region 224, a charge stored in the vicinity of the second side surface 228 of the first region 222 is discharged through regions which have a higher resistance compared to a charge stored in other regions. Since a charge which is charged and discharged through a high resistance region cannot follow a high frequency operation, the effective capacity value of the capacitor element 200 becomes smaller. However, since the second region 224 also exists in the vicinity of the second side surface 228 of the first region 222, the capacitor element 200 of the semiconductor device 10 related to the present embodiment can suppress a drop in the effective capacity value described above.

Although a structure is shown in FIG. 3 in which the second region 224 consecutively surrounds the first region 222, the present invention is not limited to this structure. For example, the second region 224 may be arranged on the first side surface 226 and second side surface 228 of the first region 222 and does not have to be arranged in the direction D2 which is perpendicular to the direction D1. In other words, in the direction D1, the second region 224 may be respectively arranged in an opposite direction with respect to the first region 222. However, in this case it is preferred that the oxide semiconductor layer 220 of the second region 224 on the first side surface 226 and second side surface 228 is conductive or a potential is supplied to each oxide semiconductor layer 220 respectively.

As described above, according to the semiconductor device 10 related to the first embodiment of the present invention, since it is possible to form the capacitor element 200 using the same structure as the transistor element 100, it is possible to provide a semiconductor device with low manufacturing costs and improved manufacturing yield. By surrounding the first region 222 with the second region 224 which has a lower resistance than the first region 222, it is possible to suppress a drop in an effective capacity value of the capacitor element 200.

[Manufacturing Method of Semiconductor Device 10]

Figure 4:
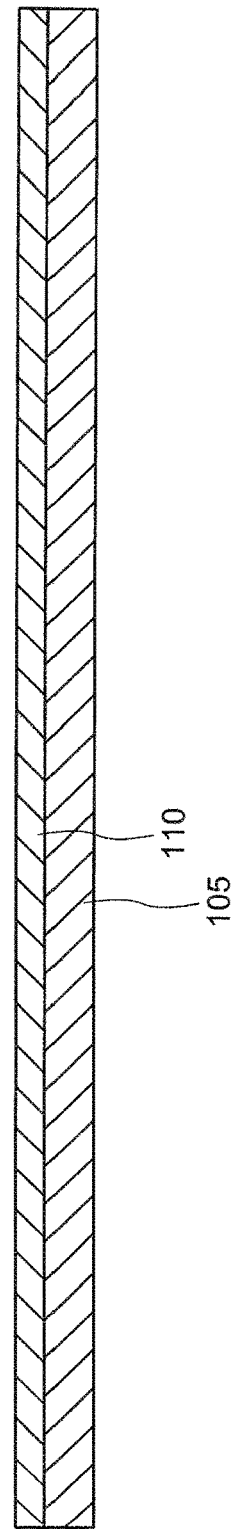
FIG. 4 is a cross-sectional diagram showing a process for forming an underlayer in a manufacturing method of a semiconductor device related to one embodiment of the present invention.

A manufacturing method of the semiconductor device 10 related to the first embodiment of the present invention is explained while referring to a cross-sectional diagram using FIG. 4 to FIG. 8. FIG. 4 is a cross-sectional diagram showing a process for forming an underlayer in the manufacturing method of a semiconductor device related to one embodiment of the present invention. As is shown in FIG. 4, the underlayer 110 is formed above the substrate 105.

Figure 5:
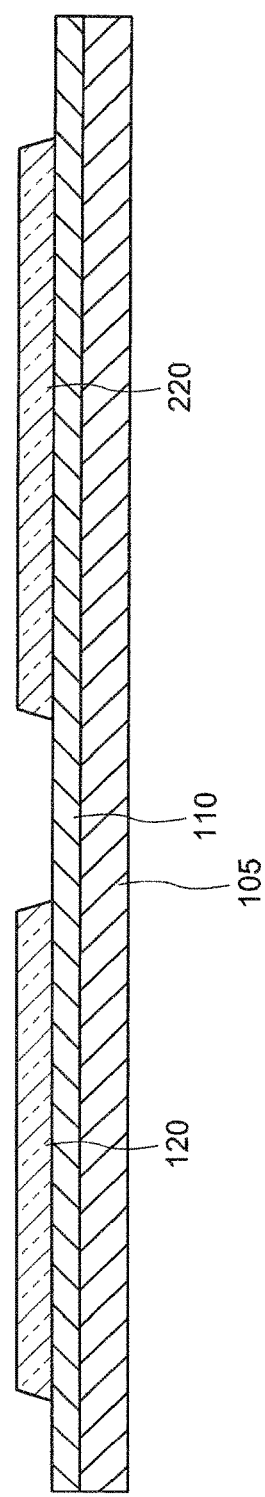
FIG. 5 is a cross-sectional diagram showing a process for forming an oxide semiconductor layer in a manufacturing method of a semiconductor device related to one embodiment of the present invention.

FIG. 5 is a cross-sectional diagram showing a process for forming an oxide semiconductor layer in a manufacturing method of a semiconductor device related to one embodiment of the present invention. As is shown in FIG. 5, an oxide semiconductor layer including the oxide semiconductor layers 120, 220 is formed on the entire surface of the substrate shown in FIG. 4, and the oxide semiconductor layers 120, 220 are patterned using photolithography and etching.

The oxide semiconductor layer including the oxide semiconductor layers 120, 220 can be formed using a sputtering method. Etching of this oxide semiconductor layer may be performed by dry etching or wet etching. An etchant including oxalic acid may be used in the case where the oxide semiconductor layers 120, 220 are formed by wet etching.

Figure 6:
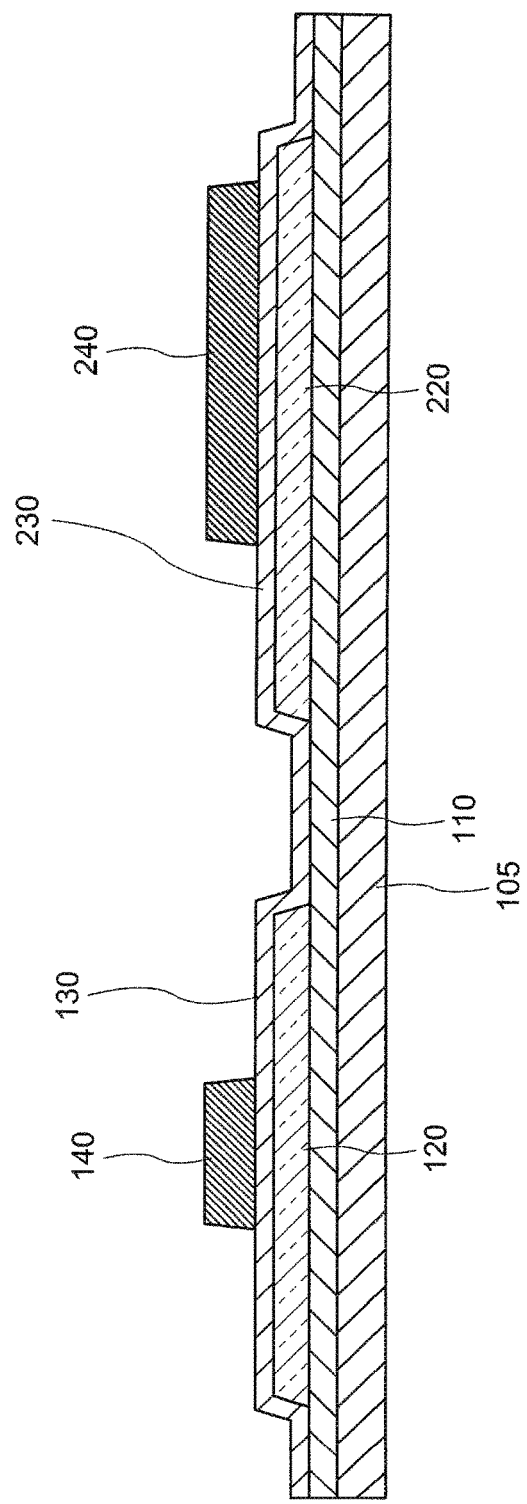
FIG. 6 is a cross-sectional diagram showing a process for forming a gate insulation layer and a gate electrode in a manufacturing method of a semiconductor device related to one embodiment of the present invention.

FIG. 6 is a cross-sectional diagram showing a process for forming a gate insulation layer and a gate electrode in a manufacturing method of a semiconductor device related to one embodiment of the present invention. As is shown in FIG. 6, a conductive layer including gate insulation layers 130, 230 and gate electrodes 140, 240 is formed above the oxide semiconductor layers 120, 220, and the gate electrodes 140, 240 as shown in FIG. 6 are patterned by photolithography and etching. Although a manufacturing method is shown in FIG. 6 in which the gate insulation layers 130, 230 function as etching stoppers of the gate electrodes 140, 240 and the oxide semiconductor layers 120, 220 are not exposed from the gate electrodes 130, 230, the present invention is not limited to this manufacturing method. For example, the gate insulation layers 130, 230 may be etched by an etching process of the gate electrodes 140, 240 and the oxide semiconductor layers 120, 220 may be exposed from the gate insulation layers 130, 230.

Figure 7:
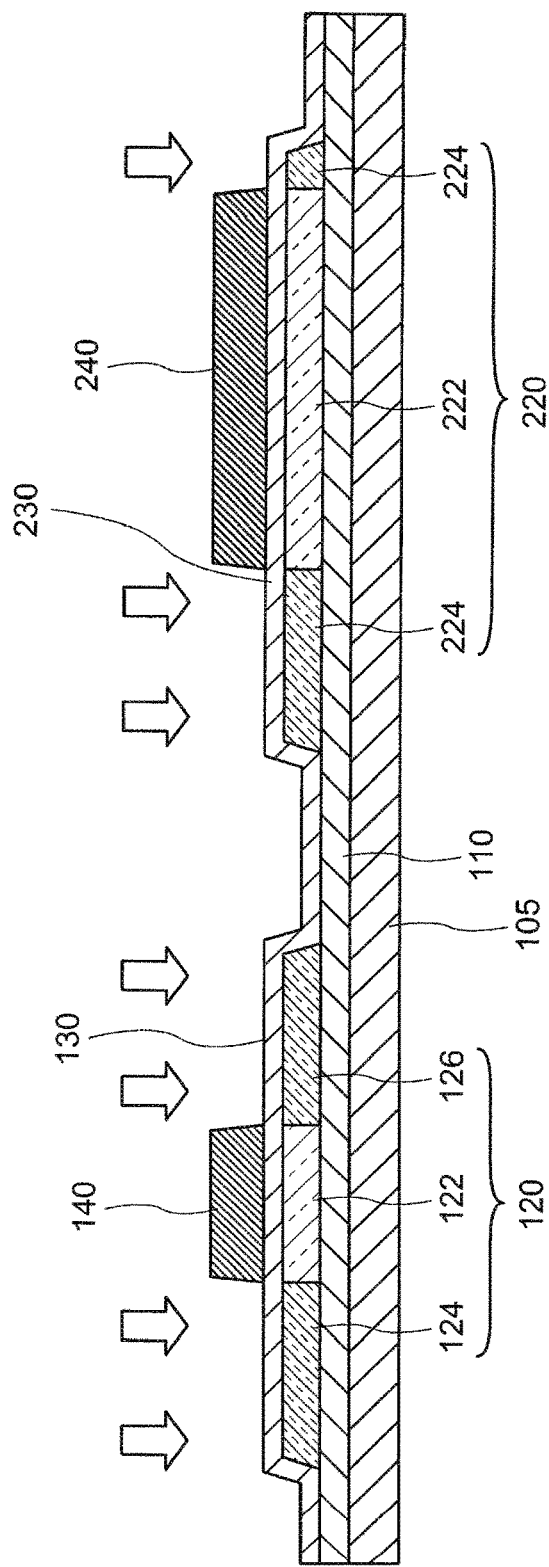
FIG. 7 is a cross-sectional diagram showing a process for doping impurities in an oxide semiconductor layer in a manufacturing method of a semiconductor device related to one embodiment of the present invention.

FIG. 7 is a cross-sectional diagram showing a process for doping impurities into an oxide semiconductor layer in a manufacturing method of a semiconductor device related to one embodiment of the present invention. As is shown in FIG. 7, impurities are doped from above (side on which the gate electrodes 140, 240 are formed with respect to the substrate 105). Impurities reach the oxide semiconductor layers 120, 220 via the gate insulation layers 130, 230 in a region which does not overlap the gate electrodes 140, 240 in a planar view. Since impurities that have been doped into the oxide semiconductor layers 120, 220 function as carriers, the resistance of the oxide semiconductor layers 120, 220 in regions doped with impurities decreases.

On the other hand, since impurities are blocked by the gate electrodes 140, 240 in regions which overlap the gate electrodes 140, 240 in a planar view, the impurities do not reach the oxide semiconductor layers 120, 220. That is, impurities do not reach the oxide semiconductor layers 120, 220 in regions which overlap the gate electrodes 140, 240 in a planar view. The oxide semiconductor layer 120 of a source region 124 and the oxide semiconductor layer 120 of a drain region 126 having a lower resistance than the oxide semiconductor layer 120 of an active layer region 122 are formed by doping impurities via the oxide semiconductor layer 120. Similarly, the oxide semiconductor layer 220 of a second region 224 having a lower resistance than the oxide semiconductor layer 220 of a first region 222 is formed by doping impurities via the oxide semiconductor layer 220.

Figure 8:
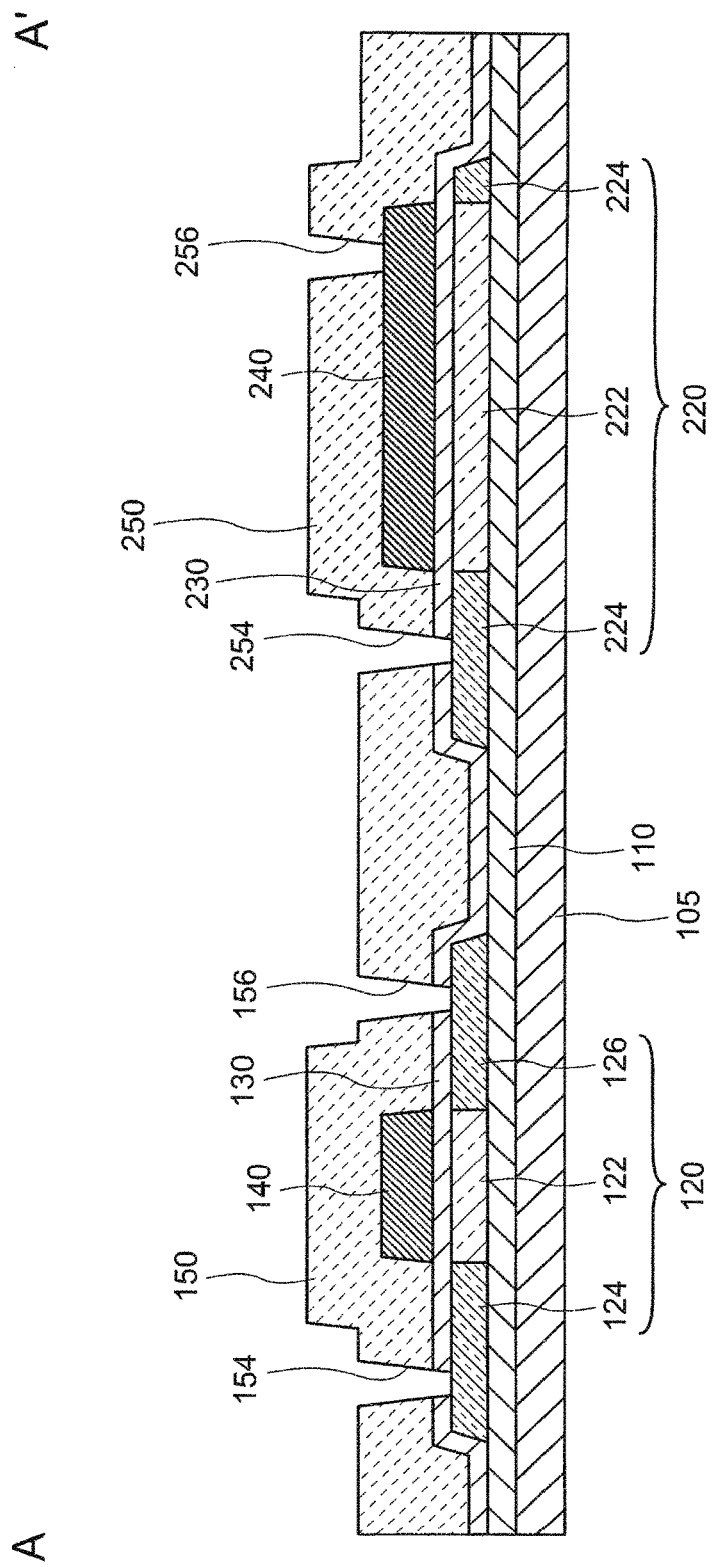
FIG. 8 is a cross-sectional diagram showing a process for forming an interlayer insulation layer in a manufacturing method of a semiconductor device related to one embodiment of the present invention.

FIG. 8 is a cross-sectional diagram showing a process for forming an interlayer insulation layer in a manufacturing method of a semiconductor device related to one embodiment of the present invention. As is shown in FIG. 8, interlayer insulation layers 150, 250 are formed above the gate electrodes 140, 240 covering the gate electrodes 140, 240 and oxide semiconductor layers 120, 220. Opening parts 154, 156, 254, 256 are formed by performing photolithography and etching on the interlayer insulation layers 150, 250. The opening parts 154, 156, 254 are formed in the interlayer insulation layers 150, 250 and the gate insulation layers 130, 230. The opening part 256 is formed only in the interlayer insulation layer 150.

The opening part 154 exposes the oxide semiconductor layer 120 of the source region 124. The opening part 156 exposes the oxide semiconductor layer 120 of the drain region 126. The opening part 254 exposes the oxide semiconductor layer 220 of the second region 224. The opening part 256 exposes the gate electrode 240. A conductive layer including the source electrode 164, drain electrode 166, first electrode 264 and second electrode 266 is formed in the substrate shown in FIG. 8, and the source electrode 164, drain electrode 166, first electrode 264 and second electrode 266 shown in FIG. 1 and FIG. 2 are formed by photolithography and etching. It is possible to form the semiconductor device 10 related to the first embodiment of the present invention by the manufacturing method described above.

<Second Embodiment>

An outline of a semiconductor device 10A related to the second embodiment of the present invention is explained using FIG. 9 to FIG. 12. In the drawings referenced in the embodiments below, the same numerals or letters of the alphabet are attached after the same numerals to the same parts or parts having the same function as in the first embodiment, and repeated explanations are omitted.

[Structure of Semiconductor Device 10A]

Figure 9:
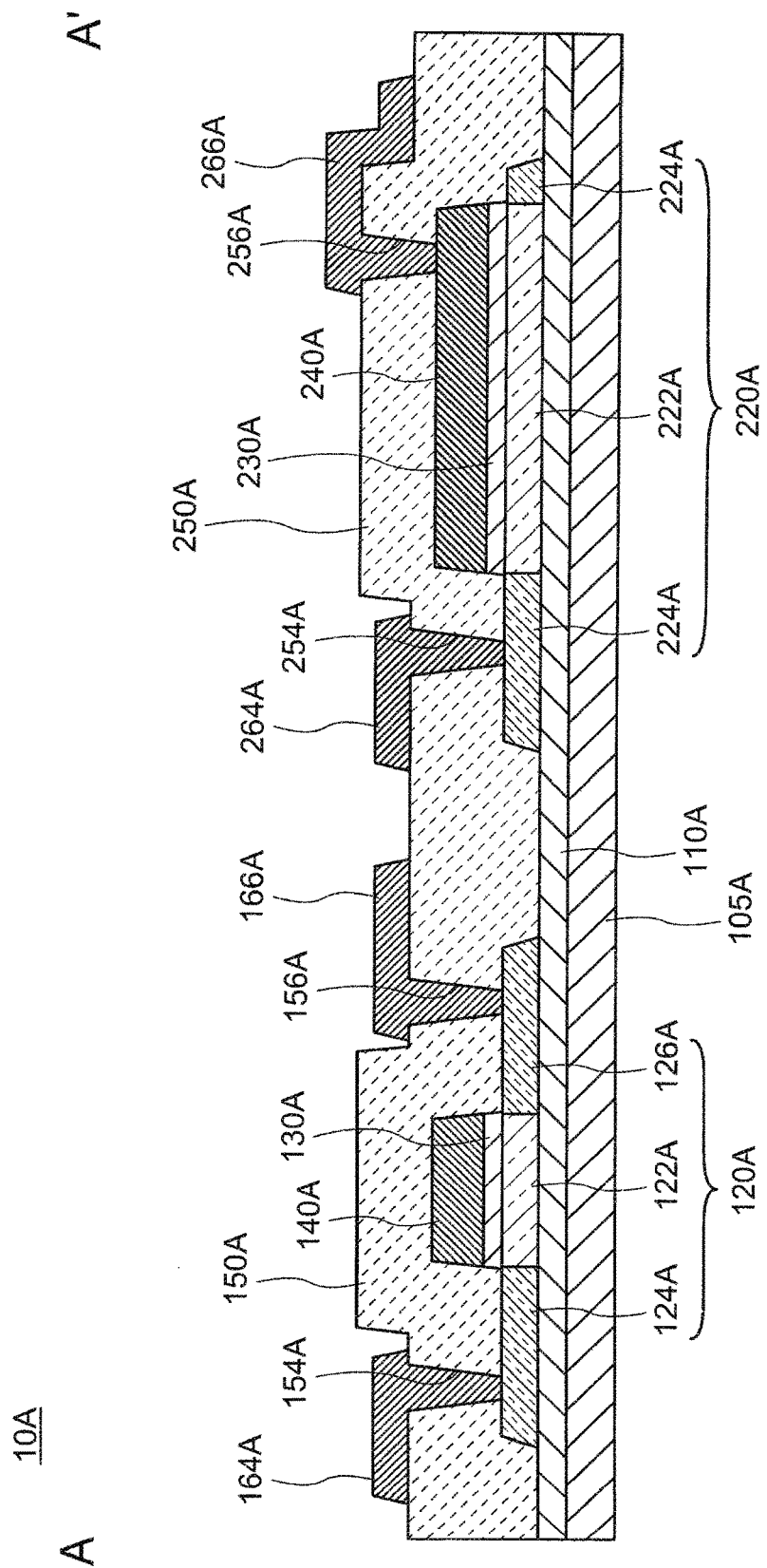
FIG. 9 is a cross-sectional diagram showing an outline of a semiconductor device related to one embodiment of the present invention.

FIG. 9 is a cross-sectional diagram showing an outline of a semiconductor device related to one embodiment of the present invention. The semiconductor device 10A shown in FIG. 9 is similar to the semiconductor device 10 shown in FIG. 1. However, the semiconductor device 10A is different to the semiconductor device 10 in that an oxide semiconductor layer 120A of a source region 124A and drain region 126A is in contact with an interlayer insulation layer 150A, and an oxide semiconductor layer 220A of a second region 224A is in contact with an interlayer insulation layer 250A. Since the oxide semiconductor layers 120A, 220A described above are in contact with the interlayer insulation layers 150A, 250A in the semiconductor device 10A, it is possible to reduce the resistance of the oxide semiconductor layers 120A, 220A using a different method than doping impurities as explained in the first embodiment. In the present embodiment, there is a larger amount of oxygen defects included in the oxide semiconductor layer 120A of the source region 124A and drain region 126A than oxygen defects included in the oxide semiconductor layer 120A of the active layer region 122A. Similarly, there is a larger amount of oxygen defects included in the oxide semiconductor layer 220A of the second region 224A than oxygen defects included in the oxide semiconductor layer 220A of the first region 222A. The interlayer insulation layers 150A, 250A include $SiN_x$.

[Manufacturing Method of Semiconductor Device 10A]

Figure 10:
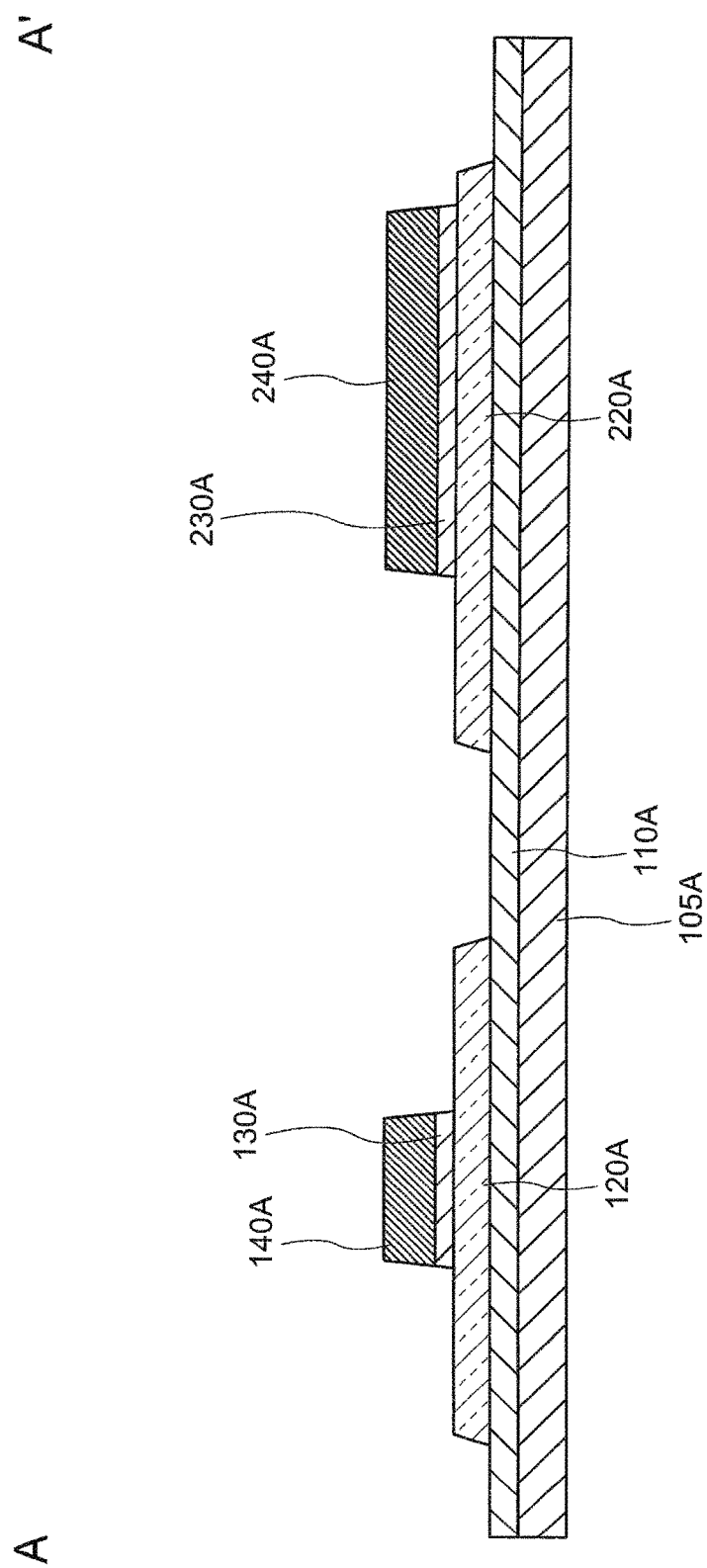
FIG. 10 is a cross-sectional diagram showing a process for forming an oxide semiconductor layer, a gate insulation layer and a gate electrode related to one embodiment of the present invention.
Figure 11:
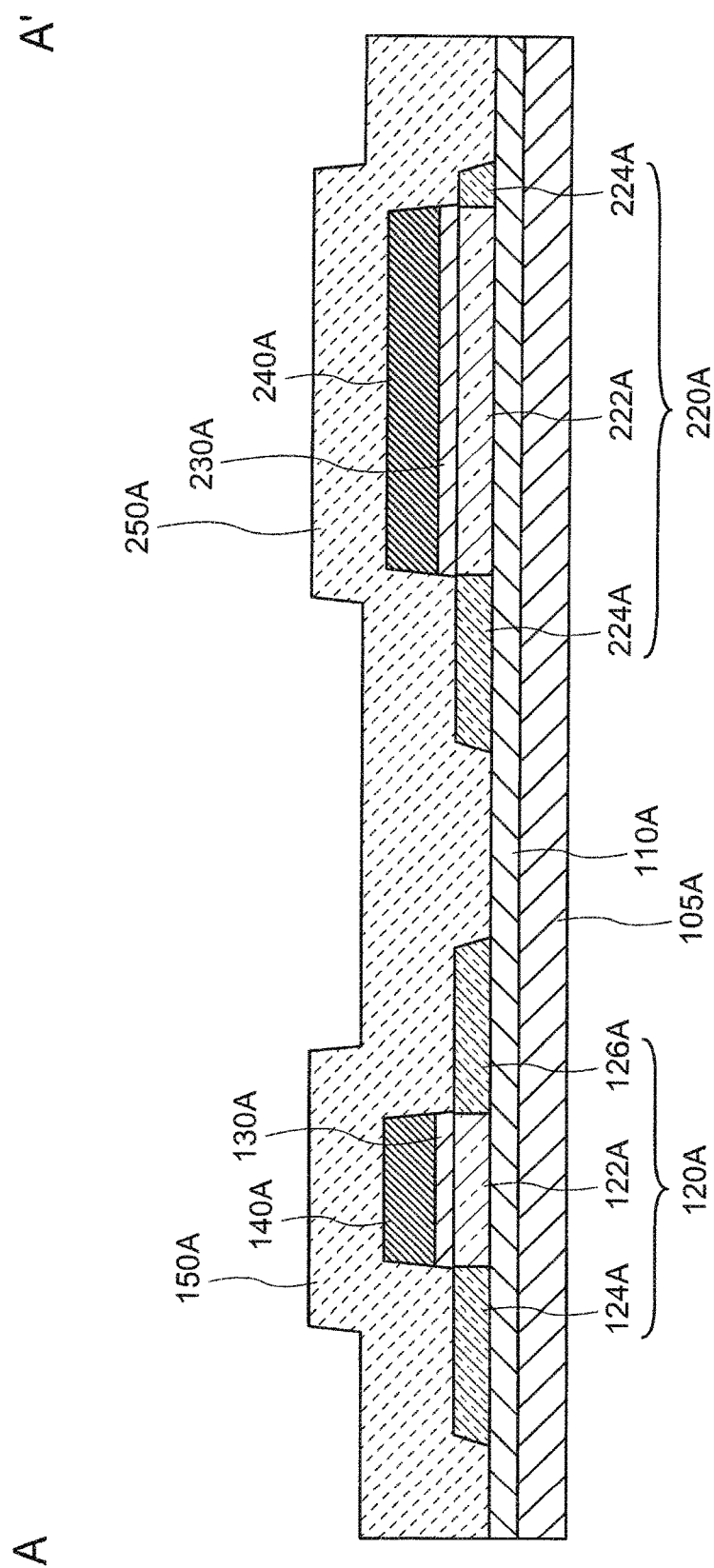
FIG. 11 is a cross-sectional diagram showing a process for forming an interlayer insulation layer in a manufacturing method of a semiconductor device related to one embodiment of the present invention.
Figure 12:
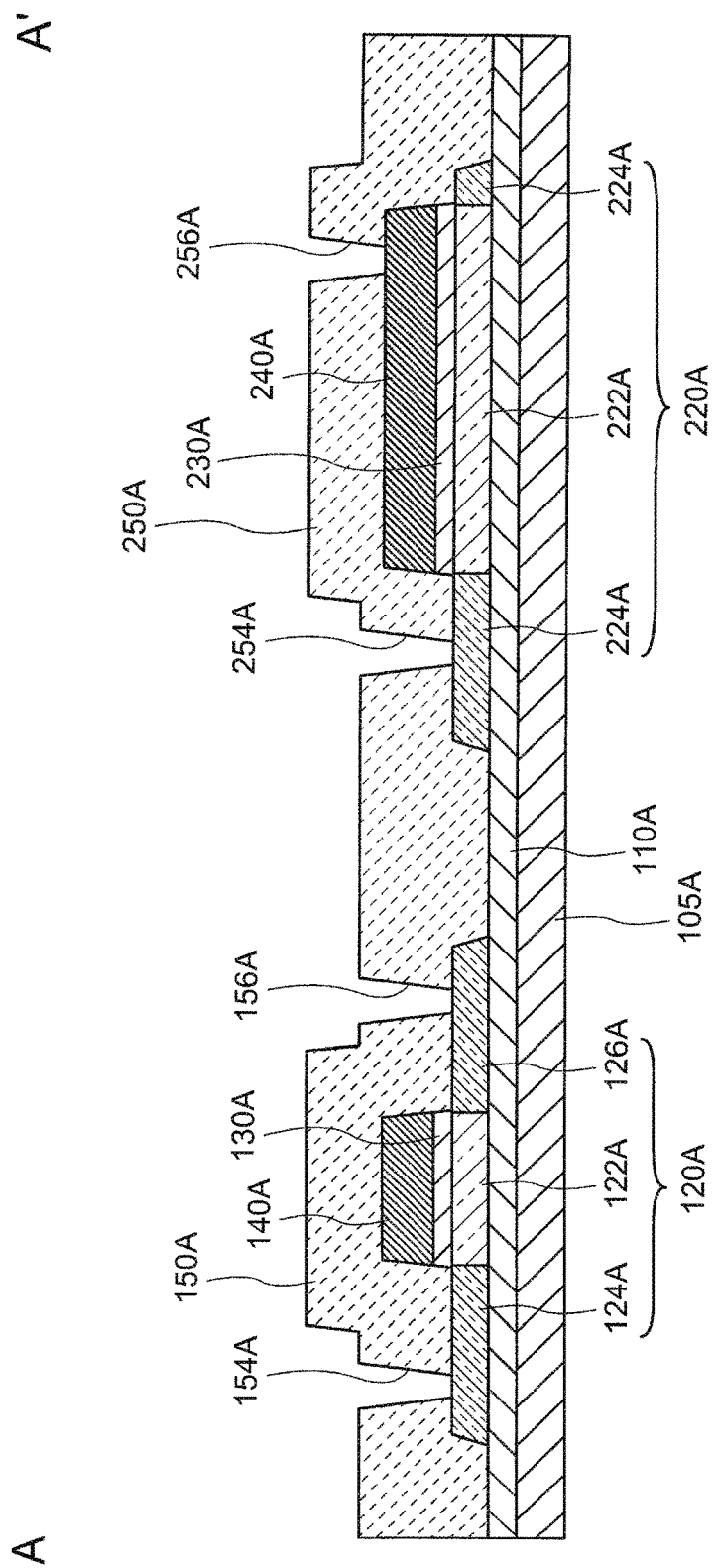
FIG. 12 is a cross-sectional diagram showing a process for forming a contact hole in an interlayer insulation layer in a manufacturing method of a semiconductor device related to one embodiment of the present invention.

A manufacturing method of the semiconductor device 10A related to the second embodiment of the present invention is explained while referring to a cross-sectional diagram using FIG. 10 to FIG. 12. FIG. 10 is a cross-sectional diagram showing a process for forming an oxide semiconductor layer, a gate insulation layer and a gate electrode related to one embodiment of the present invention. An underlayer 110A and the oxide semiconductor layers 120A, 220A are formed using the same method as in FIG. 4 and FIG. 5. A conductive layer including gate insulation layers 130A, 230A and gate electrodes 140A, 240A are formed above the oxide semiconductor layers 120A, 220A and a pattern of the gate electrodes 140A, 240A and gate insulation layers 130A, 230A shown in FIG. 10 is formed using photolithography and etching. That is, the gate electrodes 140A, 240A and gate insulation layers 130A, 230A are collectively etched and the oxide semiconductor layers 120A, 220A are exposed from the gate electrodes 140A, 240A and gate insulation layers 130A, 230A.

Although a manufacturing method is shown in the present embodiment in which a pattern of the gate electrodes 140A, 240A and gate insulation layers 130A, 230A is formed after forming the oxide semiconductor layers 120A, 220A, the present invention is not limited to this manufacturing method. For example, a pattern of the oxide semiconductor layers 120A, 220A may also be formed after forming the pattern of the gate electrodes 140A, 240A and gate insulation layers 130A, 230A. By adopting such a configuration, it is possible to make the oxide semiconductor layers 120A, 220A function as etching stoppers of the gate electrodes 140A, 240A and gate insulation layers 130A, 230A.

FIG. 11 is a cross-sectional diagram showing a process for forming an interlayer insulation layer in a manufacturing method of a semiconductor device related to one embodiment of the present invention. As is shown in FIG. 11, interlayer insulation layers 150A, 250A are formed above the gate electrodes 140A, 240A covering the gate electrodes 140A, 240A and oxide semiconductor layers 120A. 220A. The interlayer insulation layers 150A, 250A are in contact with the oxide semiconductor layers 120A, 220A. Formation of the interlayer insulation layers 150A, 250A may be performed under the formation condition that a large amount of silane is used. That is, in a gas used in the formation of the interlayer insulation layers 150A, 250A, the ratio of silane with respect to a gas other than silane may be higher than a ratio of silane with respect to a gas other than silane in a gas used in the formation of the gate insulation layers 130A, 230A. By forming the interlayer insulation layers 150A, 250A under the condition that the ratio of silane is high, it is possible to form the interlayer insulation layers 150A, 250A with a high hydrogen concentration within a film. Although the layer structure of the interlayer insulation layers 150A, 250A is not particularly limited, a stacked layer structure in which $SiN_x$ is formed above $SiO_x$ is possible for example.

By exposing the oxide semiconductor layers 120A, 220A to silane when forming the interlayer insulation layers 150A, 250A, oxygen in the oxide semiconductor layers 120A, 220A is reduced and oxygen defects in the oxide semiconductor layers 120A, 220A are produced. Since oxygen defects function as a conduction path, the resistance of the oxide semiconductor layers 120A, 220A in regions where oxygen defects are produced decreases.

A heat treatment may be performed after formation of the interlayer insulation layers 150A, 250A. By performing a heat treatment, hydrogen included in the interlayer insulation layers 150A, 250A is diffused into the oxide semiconductor layers 120A, 220A. When hydrogen reaches the oxide semiconductor layer 120A of the source region 124A and drain region 126A and the oxide semiconductor layer 220A of the second region 224A, oxygen defects are produced in the oxide semiconductor layers 120A, 220A in the regions described above.

FIG. 12 is a cross-sectional diagram showing a process for forming a contact hole in an interlayer insulation layer in a manufacturing method of a semiconductor device related to one embodiment of the present invention. As is shown in FIG. 12, opening parts 154A, 156A, 254A, 256A are formed by performing photolithography and etching on the interlayer insulation layers 150A, 250A. The opening parts 154A, 156A, 254A, 256A are formed in the interlayer insulation layers 150A, 250A. A conductive layer including the source electrode 164A, drain electrode 166A, first electrode 264A and second electrode 266A is formed in the substrate shown in FIG. 12 and the source electrode 164A, drain electrode 166A, first electrode 264A and second electrode 266A shown in FIG. 9 are formed by photolithography and etching. It is possible to form the semiconductor device 10A related to the second embodiment of the present invention using the manufacturing method described above.

As described above, according to the semiconductor device 10A related to the second embodiment of the present invention, since it is possible to form the capacitor element 200A using the same structure as the transistor element 100A, it is possible to provide a semiconductor device with low manufacturing costs and improved manufacturing yield.

It is possible to reduce the resistance of the oxide semiconductor layers 120A, 220A even without doping impurities to the oxide semiconductor layers 120A, 220A.

<Third Embodiment>

An outline of a display device related to a third embodiment of the present invention is explained using FIG. 13 to FIG. 16. A display device is a pixel circuit using the transistor element and capacitor element explained using the semiconductor device 10 in the first embodiment or the semiconductor device 10A in the second embodiment. The pixel circuit shown as a display device related to the present embodiment is a pixel circuit of an EL display device. However, the capacitor element described above is not limited to a pixel circuit of an EL display device and it is possible to be used in a circuit in which the magnitude relationship of a potential supplied to a pair of electrodes is not inverted.

A monochromatic pixel for realizing full color is called a sub-pixel. The minimum unit of a sub-pixel which can realize full color or white color is called a main pixel. In the explanation below, a circuit arranged in a sub-pixel is explained as a pixel circuit. In the drawings referenced in the embodiments below, the same numerals or letters of the alphabet are attached after the same numerals to the same parts or parts having the same function as in the first embodiment, and repeated explanations are omitted.

[Pixel Circuit Structure of Sub-Pixel 300B]

Figure 13:
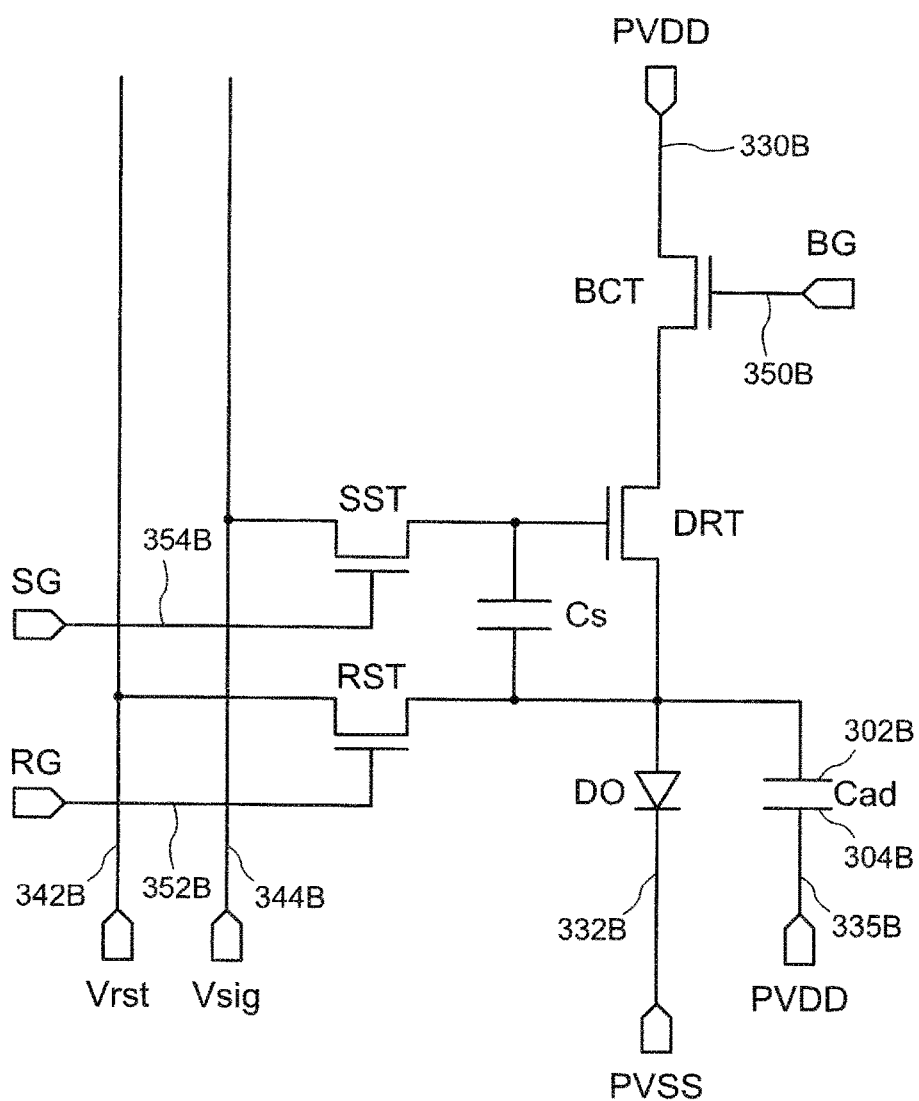
FIG. 13 is a diagram showing an example of a circuit structure using a capacitor element in a semiconductor device related to one embodiment of the present invention.

FIG. 13 is a diagram showing an example of a circuit structure using a capacitor element in a semiconductor device related to one embodiment of the present invention. All the transistors which form a sub-pixel 300B shown in FIG. 12 are n channel type transistors. As is shown in FIG. 13, the sub-pixel 300B includes a light emitting element DO, a drive transistor DRT, an output transistor BCT, a reset transistor RST, a pixel selection transistor SST, a storage capacitor Cs and an auxiliary capacitor Cad. The capacitor element 200 of the semiconductor device 10 or the capacitor element 200A of the semiconductor device 10A is used for the auxiliary capacitor Cad. The transistor element 100 of the semiconductor device 10 or the transistor element 100A of the semiconductor device 10A is used for the drive transistor DRT, output transistor BCT, reset transistor RST and pixel selection transistor SST.

A cathode electrode of the light emitting element DO is connected to a cathode power supply line 332B. An anode electrode of the light emitting element DO is connected to a drain electrode of the drive transistor DRT, a drain electrode of the reset transistor RST, a first electrode of the storage capacitor Cs and a first electrode 302B of the auxiliary capacitor Cad. A second electrode 304B of the auxiliary capacitor Cad is connected to an anode power supply line 335B. An anode power supply potential PVDD supplied to the anode power supply line 335B is higher than a cathode power supply potential PVSS supplied to the cathode power supply line 332B.

A source electrode of the drive transistor DRT is connected to an anode power supply line 330B via the output transistor BCT. An anode power supply potential PVDD is supplied to the anode power supply line 330B. A gate electrode of the drive transistor DRT is connected to a second electrode of the storage capacitor Cs and a drain electrode of the pixel selection transistor SST. A source electrode of the reset transistor RST is connected to a reset power supply line 342B. A reset power supply potential Vrst is supplied to the reset power supply line 342B. A source electrode of the pixel selection transistor SST is connected to an image signal line 344B. An image signal Vsig is supplied to the image signal line 344B.

A gate electrode of the output transistor BCT is connected to an output control signal line 350B. An output control signal BG is supplied to the output control signal line 350B. A gate electrode of the reset transistor RST is connected to a reset control signal line 352B. A reset control signal RG is supplied to the reset control signal line 352B. A gate electrode of the pixel selection transistor SST is connected to a pixel control signal line 354B. A pixel control signal SG is supplied to the pixel control signal line 354B.

A potential corresponding to an image signal (or gradation signal) is supplied to the gate electrode of the drive transistor DRT. That is, the drive transistor DRT supplies a current corresponding to an image signal to a light emitting element DO based on an anode power supply potential PVDD supplied via the output transistor BCT. In this way, since the anode power supply potential PVDD supplied to the anode power supply line 330B drops due to the drive transistor DRT and output transistor BCT, a potential lower than an anode power supply potential PVDD is supplied to the anode electrode of the light emitting element DO. That is, a potential higher than the first electrode 302B of the auxiliary capacitor Cad is always supplied to the second electrode 304B of the auxiliary capacitor Cad. For example, the first electrode 302B corresponds to the first electrode 264 in the semiconductor device 10 shown in FIG. 2, and the second electrode 304B corresponds to the second electrode 266 in the semiconductor device 10. Since a potential higher than the first electrode 264 is always supplied to the second electrode 266, the first region 222 becomes a conducting state. In this way, the oxide semiconductor layer 220 in the entire first region 222 functions as an electrode of a capacitor element.

[Modified Example 1 of Pixel Circuit Structure of Sub-Pixel 300C]

Figure 14:
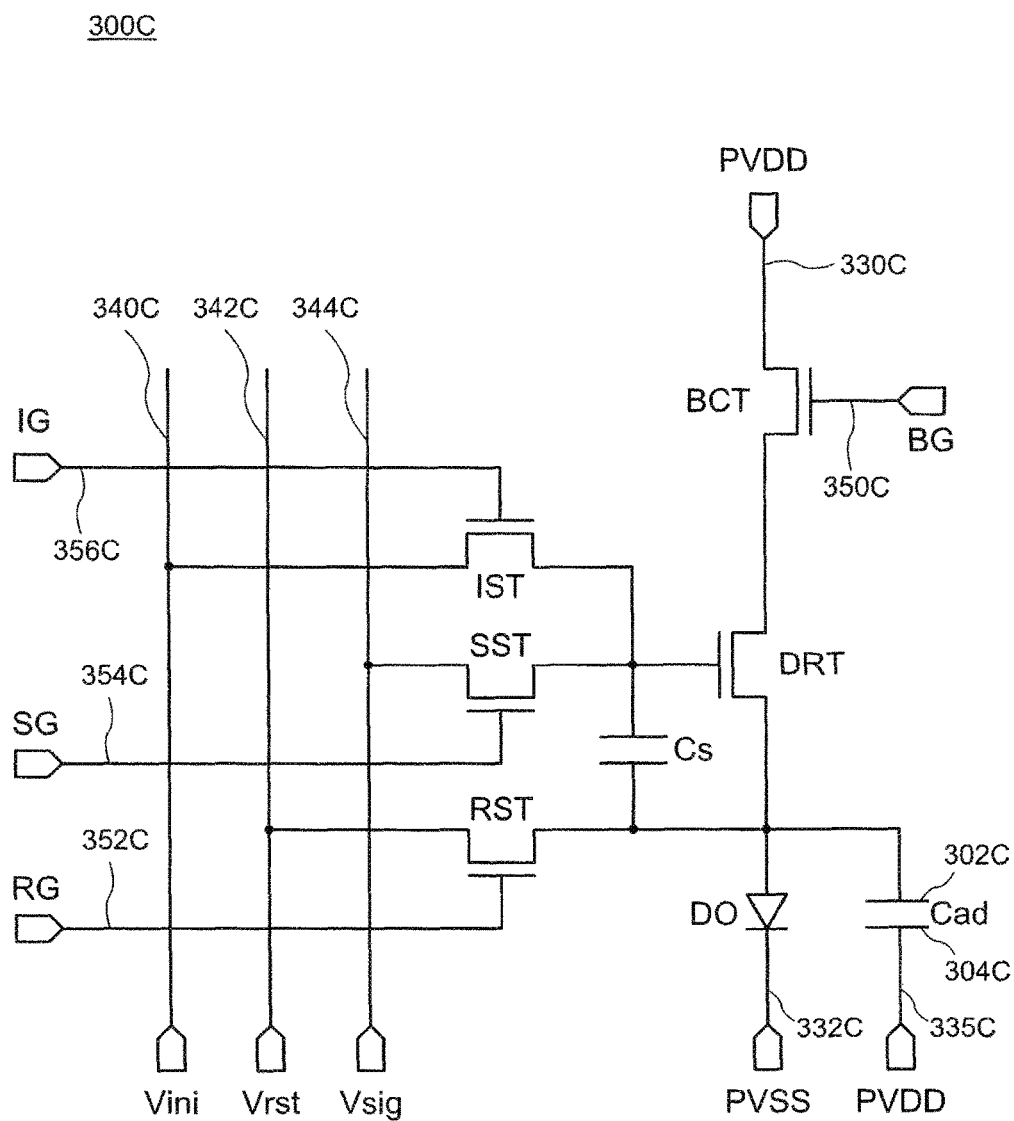
FIG. 14 is a diagram showing an example of a circuit structure using a capacitor element in a semiconductor device related to a modified example of one embodiment of the present invention.

FIG. 14 is a diagram showing an example of a circuit structure using a capacitor element in a semiconductor device related to a modified example of one embodiment of the present invention. Although the sub-pixel 300C shown in FIG. 14 is similar to the sub-pixel 300B shown in FIG. 13, the sub-pixel 300C is different to the sub-pixel 300B in that an initialization power supply line 340C is connected to the gate electrode of the drive transistor DRT via an initialization transistor IST. An initialization potential Vini is supplied to the initialization power supply line 340C. A gate electrode of the initialization transistor IST is connected to an initialization control signal line 356C. An initialization control signal IG is supplied to initialization control signal line 356C.

The same as the sub-pixel 300B in FIG. 13, in the sub-pixel 300C in FIG. 14, a potential lower than an anode power supply potential PVDD is supplied to an anode electrode of a light emitting element DO. That is, a potential which is always higher than the first electrode 302C of the auxiliary capacitor Cad is supplied to the second electrode 304C of the auxiliary capacitor Cad. By using the first electrode 264 in the semiconductor device 10 shown in FIG. 2 as the first electrode 302C and using the second electrode 266 as the second electrode 304C, the oxide semiconductor layer 220 in the entire first region 222 functions as an electrode of a capacitor element.

[Modified Example 2 of Pixel Circuit Structure of Sub-Pixel 300D]

Figure 15:
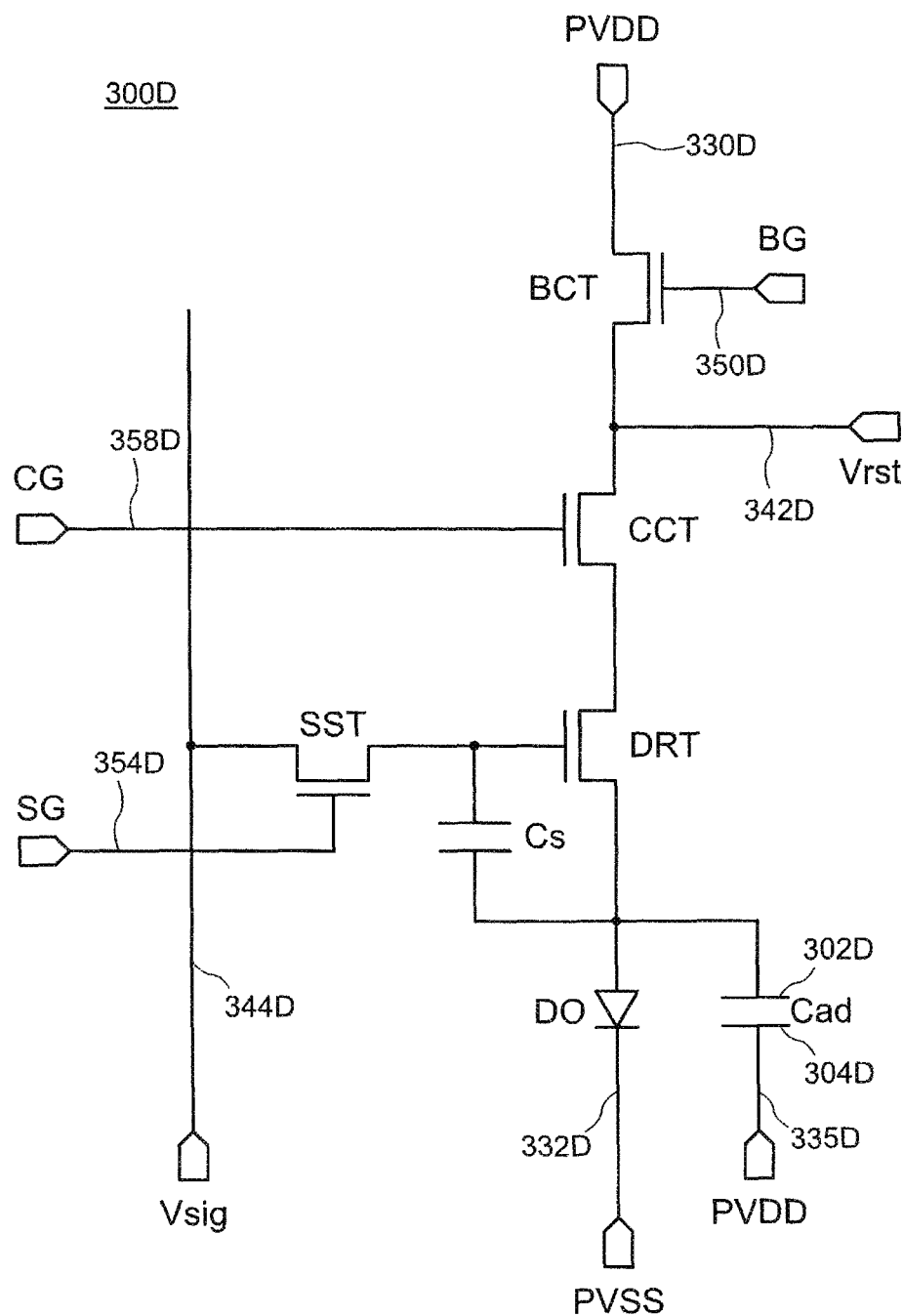
FIG. 15 is a diagram showing an example of a circuit structure using a capacitor element in a semiconductor device related to a modified example of one embodiment of the present invention.

FIG. 15 is a diagram showing an example of a circuit structure using a capacitor element in a semiconductor device related to a modified example of one embodiment of the present invention. Although the sub-pixel 300D shown in FIG. 15 is similar to the sub-pixel 300B shown in FIG. 13, the sub-pixel 300D is different to the sub-pixel 300B in that a reset transistor RST is not connected to an anode electrode of a light emitting element DO, a cross-talk cancel transistor CCT is arranged between a drive transistor DRT and an output transistor BCT, and a reset power supply line 342D is connected between a cross-talk cancel transistor CCT and an output transistor BCT. A gate electrode of the cross-talk cancel transistor CCT is connected to a cross-talk cancel control signal line 358D. A cross-talk cancel control signal CG is supplied to the cross-talk cancel control signal line 358D.

The same as the sub-pixel 300B in FIG. 13, in the sub-pixel 300D in FIG. 15, a potential lower than an anode power supply potential PVDD is supplied to an anode electrode of a light emitting element DO. That is, a potential which is always higher than the first electrode 302D of the auxiliary capacitor Cad is supplied to the second electrode 304D of the auxiliary capacitor Cad. By using the first electrode 264 in the semiconductor device 10 shown in FIG. 2 as the first electrode 302D and using the second electrode 266 as the second electrode 304D, the oxide semiconductor layer 220 in the entire first region 222 functions as an electrode of a capacitor element.

[Modified Example 3 of Pixel Circuit Structure of Sub-Pixel 300E]

Figure 16:
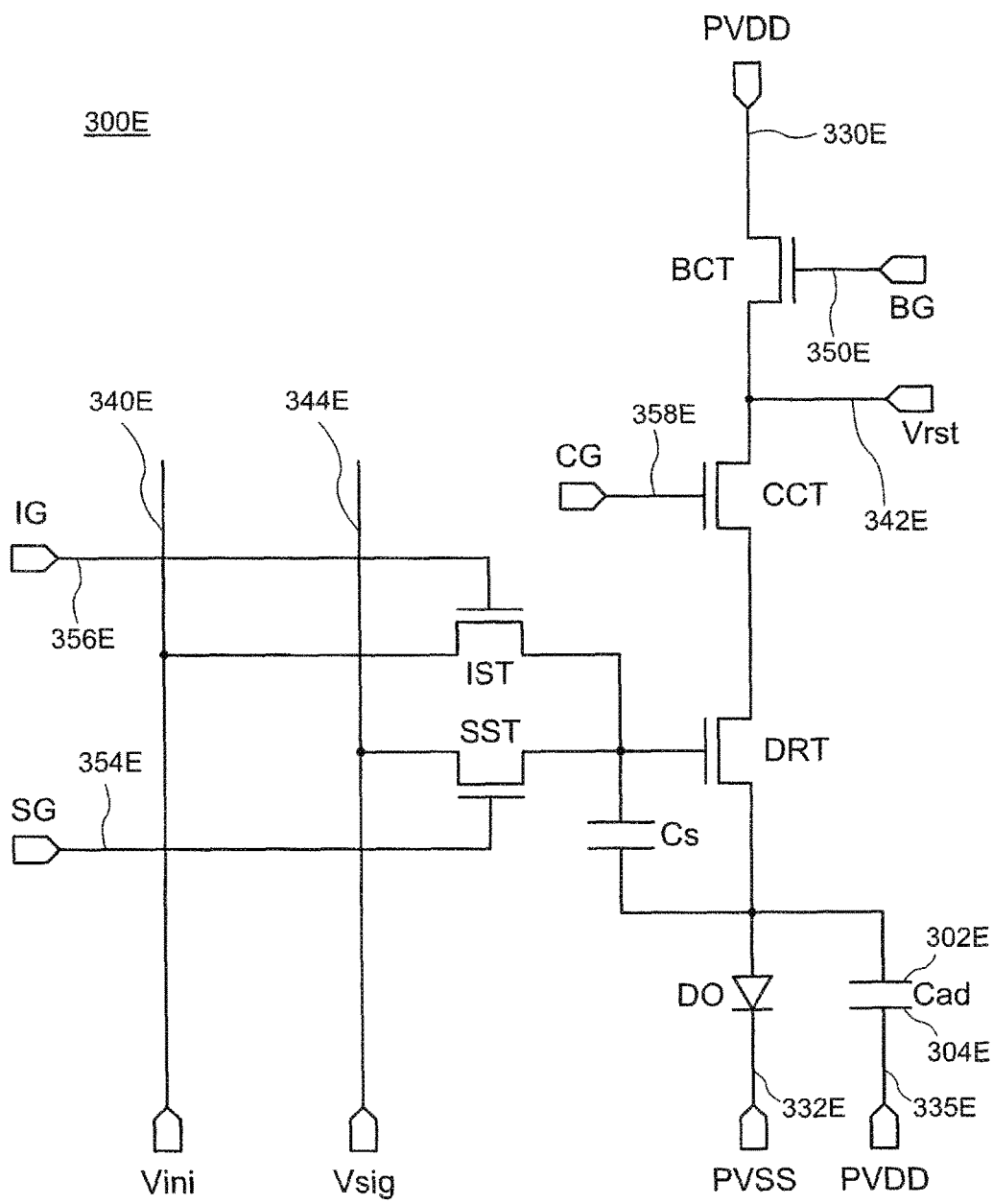
FIG. 16 is a diagram showing an example of a circuit structure using a capacitor element in a semiconductor device related to a modified example of one embodiment of the present invention.

FIG. 16 is a diagram showing an example of a circuit structure using a capacitor element in a semiconductor device related to a modified example of one embodiment of the present invention. Although the sub-pixel 300E shown in FIG. 16 is similar to the sub-pixel 300C shown in FIG. 14, the sub-pixel 300E is different to the sub-pixel 300C in that a reset transistor RST is not connected to an anode electrode of a light emitting element DO, a cross-talk cancel transistor CCT is arranged between a drive transistor DRT and an output transistor BCT, and a reset power supply line 342E is connected between a cross-talk cancel transistor CCT and an output transistor BCT. A gate electrode of the cross-talk cancel transistor CCT is connected to a cross-talk cancel control signal line 358E. A cross-talk cancel control signal CG is supplied to the cross-talk cancel control signal line 358E.

The same as the sub-pixel 300C in FIG. 14, in the sub-pixel 300E in FIG. 16, a potential lower than an anode power supply potential PVDD is supplied to an anode electrode of a light emitting element DO. That is, a potential which is always higher than the first electrode 302E of the auxiliary capacitor Cad is supplied to the second electrode 304E of the auxiliary capacitor Cad. By using the first electrode 264 in the semiconductor device 10 shown in FIG. 2 as the first electrode 302E and using the second electrode 266 as the second electrode 304E, the oxide semiconductor layer 220 in the entire first region 222 functions as an electrode of a capacitor element.

As described above, according to the display device related to the third embodiment of the present invention and modified examples thereof, since it is possible to form a storage capacitor (auxiliary capacitor Cad) using the same structure as a transistor element, it is possible to provide a display device with low manufacturing costs and improved manufacturing yield.

<Fourth Embodiment>

Figure 17:
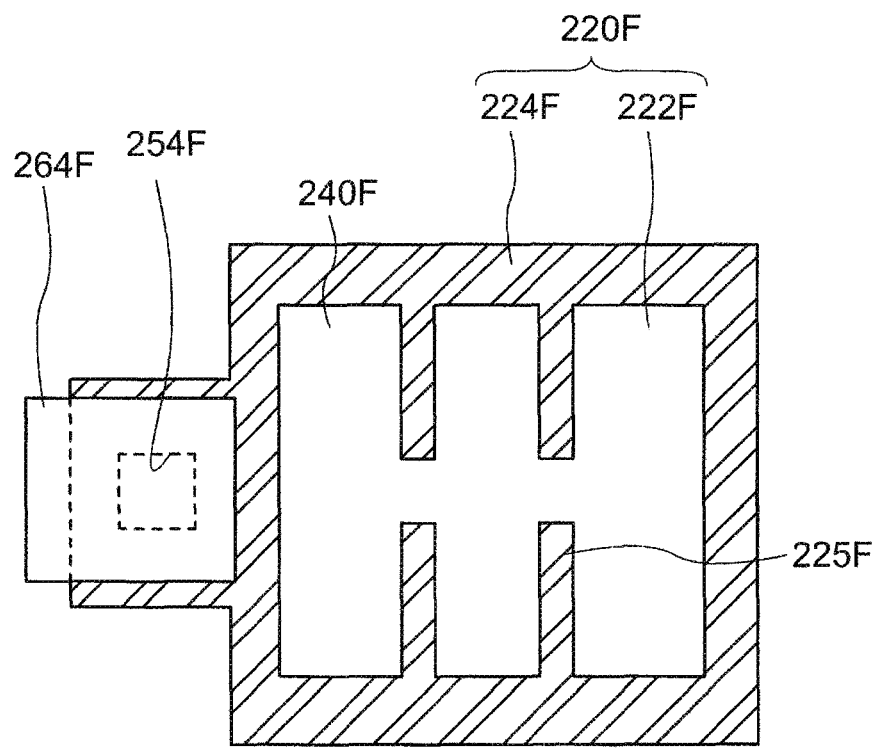
FIG. 17 is a planar diagram showing a low resistance region of an oxide semiconductor layer in a semiconductor device related to one embodiment of the present invention.

An outline of a semiconductor device 10F related to a fourth embodiment of the present invention is explained using FIG. 17. In the semiconductor device 10F, the shape of a first region 222F and second region 224F in a capacitor element 200F is explained.

[Pattern of First Region 222F and Second Region 224F]

FIG. 17 is a planar diagram showing a low resistance region of an oxide semiconductor layer in a semiconductor device related to one embodiment of the present invention. In FIG. 17, the second region 224F is the region drawn with a hatched line. FIG. 17 is drawn with the second electrode 266 and opening part 256 drawn in FIG. 1 omitted. As is shown in FIG. 17, the second region 224F consecutively surrounds the first region 222F. Furthermore, the second region 224F is arranged with a protruding region 225F which protrudes to the inner side of the first region 222F in a planar view. In other words, a slit (a region corresponding to the protruding region 225F) is arranged in a part of the first region 222F. Furthermore, in other words, a gate electrode 240F is arranged with a notch region (region corresponding to the protruding region 225F) which extends towards the inner side of the gate electrode 240F in planar view. Furthermore, although a structure is shown in FIG. 17 in which the protruding region 225F has a shape having a long side in a direction D2, a structure is also possible in which the protruding region 225F has a shape having a long side in a direction D1.

By arranging the second region 224F with the protruding region 225F, it is possible to further shorten the longest distance (distance between the furthest point from the second region 224F in the first region 222F and the nearest second region 224F from that point) from the second region 224F in the first region 222F. Therefore, it is possible to control a drop in an effective capacity value.

As described above, according to the semiconductor device 10F related to the fourth embodiment of the present invention, since it is possible to form the capacitor element 200F with the same structure as the transistor element 100F, it is possible to provide a semiconductor device with low manufacturing costs and improved manufacturing yield. By arranging the protruding region 225F in the second region 224F in the capacitor element 200F, it is possible to suppress a reduction in an effective capacity value of the capacitor element 200F.

The present invention is not limited to any of the above-described embodiments, and may be appropriately altered without departing from the gist of the present invention.

What is claimed is:

1. A semiconductor device comprising:
    an n-type oxide semiconductor layer;
    a gate electrode above the oxide semiconductor layer;
    a gate insulation layer between the oxide semiconductor layer and the gate electrode;
    a first terminal connected to the oxide semiconductor layer; and
    a second terminal connected to the gate electrode, a potential applied to the second terminal being higher than a potential applied to the first terminal;
    wherein the oxide semiconductor layer is arranged with a first region overlapping the gate electrode in a planar view and a second region exposed from the gate electrode in a planar view, a resistance of the oxide semiconductor layer in the second region being lower than a resistance of the oxide semiconductor layer in the first region, and
    there are more impurities included in the oxide semiconductor layer in the second region than impurities included in the oxide semiconductor layer in the first region.

2. A semiconductor device comprising:
an n-type oxide semiconductor layer;
a gate electrode above the oxide semiconductor layer;
a gate insulation layer between the oxide semiconductor layer and the gate electrode;
a first terminal connected to the oxide semiconductor layer; and
a second terminal connected to the gate electrode, a potential applied to the second terminal being higher than a potential applied to the first terminal;
wherein
the oxide semiconductor layer is arranged with a first region overlapping the gate electrode in a planar view and a second region exposed from the gate electrode in a planar view, a resistance of the oxide semiconductor layer in the second region being lower than a resistance of the oxide semiconductor layer in the first region, and
there are more oxygen defects included in the oxide semiconductor layer in the second region than oxygen defects included in the oxide semiconductor layer in the first region.

3. The semiconductor device according to claim 2, further comprising:
an insulation layer covering the oxide semiconductor layer, the gate insulation layer and the gate electrode;
wherein
the oxide semiconductor layer in the second region is exposed from the gate insulation layer and is in contact with the insulation layer.

4. The semiconductor device according to claim 3, wherein the insulation layer includes silicon nitride.

5. A semiconductor device comprising:
a p-type oxide semiconductor layer;
a gate electrode above the oxide semiconductor layer;
a gate insulation layer between the oxide semiconductor layer and the gate electrode;
a first terminal connected to the oxide semiconductor layer; and
a second terminal connected to the gate electrode, a potential applied to the second terminal being lower than a potential applied to the first terminal;
wherein
the oxide semiconductor layer is arranged with a first region overlapping the gate electrode in a planar view and a second region exposed from the gate electrode in a planar view, a resistance of the oxide semiconductor layer in the second region being lower than a resistance of the oxide semiconductor layer in the first region, and
there are more impurities included in the oxide semiconductor layer in the second region than impurities included in the oxide semiconductor layer in the first region.

6. A semiconductor device comprising:
a p-type oxide semiconductor layer;
a gate electrode above the oxide semiconductor layer;
a gate insulation layer between the oxide semiconductor layer and the gate electrode;
a first terminal connected to the oxide semiconductor layer; and
a second terminal connected to the gate electrode, a potential applied to the second terminal being lower than a potential applied to the first terminal;
wherein
the oxide semiconductor layer is arranged with a first region overlapping the gate electrode in a planar view and a second region exposed from the gate electrode in a planar view, a resistance of the oxide semiconductor layer in the second region being lower than a resistance of the oxide semiconductor layer in the first region, and
there are more oxygen defects included in the oxide semiconductor layer in the second region than oxygen defects included in the oxide semiconductor layer in the first region.

7. The semiconductor device according to claim 6, further comprising:
an insulation layer covering the oxide semiconductor layer, the gate insulation layer and the gate electrode;
wherein
the oxide semiconductor layer in the second region is exposed from the gate insulation layer and is in contact with the insulation layer.

8. The semiconductor device according to claim 7, wherein the insulation layer includes silicon nitride.

* * * * *